United States Patent [19]

Kasai

[11] Patent Number: 4,511,202

[45] Date of Patent: Apr. 16, 1985

[54] CERAMIC RESONATOR AND A CERAMIC FILTER USING THE SAME

[75] Inventor: Yoshihiko Kasai, Yokohama, Japan

[73] Assignee: Fujitsu Limited, Kawasaki, Japan

[21] Appl. No.: 450,790

[22] Filed: Dec. 17, 1982

[30] Foreign Application Priority Data

Dec. 29, 1981 [JP] Japan ................................. 56-213743
Feb. 24, 1982 [JP] Japan ................................. 57-28430
Apr. 7, 1982 [JP] Japan ................................. 57-57588

[51] Int. Cl.³ ...................... H03H 9/48; H03H 9/205; H03H 9/13; H03H 9/56
[52] U.S. Cl. .................................. 333/189; 333/187; 333/191; 310/321; 310/328; 310/366; 310/367
[58] Field of Search ................................ 333/187–192; 310/320–323, 326–327, 328–333, 357–359, 365–368

[56] References Cited

U.S. PATENT DOCUMENTS

| 3,437,848 | 4/1969 | Börner et al. | 333/187 X |
| 3,559,116 | 1/1971 | Egerton et al. | 333/191 |
| 3,697,788 | 10/1972 | Parker et al. | 333/191 X |

FOREIGN PATENT DOCUMENTS 51-1051 6/1976 Japan .
52-18148 2/1977 Japan .
55-64413 5/1980 Japan .
56-134718 10/1981 Japan .
56-134818 10/1981 Japan .

OTHER PUBLICATIONS

Shimizu–"New Energy Trapping Techniques", EM Symposium, published Mar. 11, 1980; pp. 1–34.

Primary Examiner—Marvin L. Nussbaum
Attorney, Agent, or Firm—Staas & Halsey

[57] ABSTRACT

A ceramic resonator including an elongated piezoelectric ceramic platelet having an indentation formed in the center in the longitudinal direction, a polarization in the thickness direction where the polarization occurs at least in the indentation; first and second main surfaces; first and third metal thin film electrodes formed on said first main surface and second and fourth metal thin film electrodes formed on said second main surface, the third electrode being separated from the first electrode and the fourth electrode separated from the second electrode where the resonator has a constant vibration based on the dimensions of the region associated with the indentation the vibration being generated at the narrow part when an electrical signal is applied to the electrodes. Moreover, a ceramic filter consisting of plurality of the ceramic resonators connected in series can also be configured.

13 Claims, 27 Drawing Figures

CERAMIC RESONATOR AND A CERAMIC FILTER USING THE SAME

BACKGROUND OF THE INVENTION

1. Technical Field of the Invention

This invention relates to an energy trapping ceramic resonator wherein mechanical vibration energy is concentrated to a part of a piezoelectric ceramic resonator and a ceramic filter using said ceramic resonator.

A ceramic resonator using a piezoelectric ceramic material provides many advantages such as small size, no adjustment and, coil etc. and therefore, is widely used as the intermediate frequency filter of radio communication equipment. Moreover, with excellent alignment with IC's and LSI's and advancement in the performance of recent piezoelectric ceramic materials, these ceramic resonators will expand their applicable fields in the future.

The ceramic resonators being placed in practical use can be classified into two groups; those utilizing contour vibration, such as radial mode vibration, and the so-called energy trapping type, utilizing the thickness (or width)-extensional vibration or thickness (or width)-shear vibration. However, these ceramic resonators are hard to fabricate for the frequency range from several hundred kHz to several MHz and becomes large for such a frequency band, thus delaying the realization of practical use. Recently, a new type resonator, different from the conventional ones, (the conventional one being the edge mode resonator, the thickness shear resonator, and the thickness-extensional resonator) has been noted for use as a ceramic resonator used in the bandwidth from several hundred kHz to several MHz.

A ceramic resonator using the thickness extensional vibration of a rectangular shape piezoelectric ceramic plate can be manufactured very easily because the polarizing direction and the AC field direction for activating vibration are identical. Moreover, since a small energy trapping type resonator can be realized for the frequency range from several hundreds kHz to several MHz, it is suitable as a ceramic resonator in the above-mentioned frequency band which has conventionally been considered difficult to obtain.

2. Description of the Prior Art

A resonator utilizing contour vibration, such as the radial mode vibration, can be made smaller as its frequency range becomes higher, because the resonant frequency is reversely proportional to dimensions of its contours or to the diameter in the case of a disk, thus making manufacturing difficult. Therefore, the upper end of the practical frequency range is limited to several hundreds kHz. Moreover, in a resonator utilizing contour vibration, the entire body vibrates and it is only at the node that the vibration displacement becomes zero; the node is located at the center of the disk in the case of a radial mode vibration. For this reason, a resonator is supported at the node. When a supporting means at the node is made more rigid, energy leaks to the outside through the supporting means and, therefore, a comparatively soft supporing means is generally employed. As a result, reliability to external vibration is lowered.

Figure 1A:
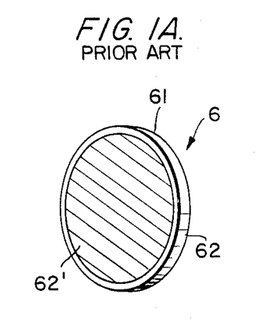
FIG. 1A is a perspective view of a conventional resonator utilizing radial vibration mode.
Figure 1B:
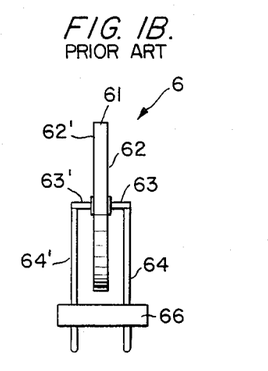
FIG. 1B is a side view of a holding means in a conventional resonator.
Figure 1C:
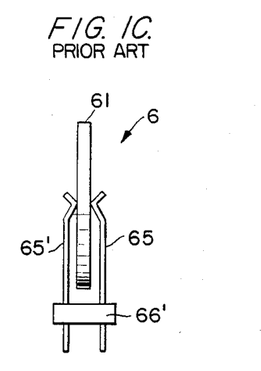
FIG. 1C is a side view of another holding means in a conventional resonator.

FIG. 1A is a perspective view of a resonator utilizing the above-mentioned radial mode vibration. In this figure, the thin film electrodes 62, 62' are formed by evaporation on both sides of the piezoelectric ceramic platelet 61. This resonator is supported in such a manner as shown in FIGS. 1B, C. In FIG. 1B, one end of a thin wire 63 is fixed to the metal supporting post 64 which is in turn clamped to the insulation substrate 66. The wire affixed, with conductive adhesive, to the center of the metal thin film 62 on both sides of the piezoelectric ceramic platelet 61. In FIG. 1C, a metal supporting means 65, fixed to the insulation substrate 66', is composed of an elastic material and the supporting means 65 is connected, at its end portion, to the center of metal thin film electrodes 62, 62' on both sides of the piezoelectric ceramic platelet 61, in order to hold the resonator 6.

On the other hand, a resonator utilizing the thickness-extensional vibration or thickness-shear vibration of a piezoelectric ceramic platelet is capable of assuring high reliability to external vibration. This is because the resonant frequency is reversely proportional to the plate thickness and vibration energy is trapped at the center of the plate, therefore, the external edge of the piezoelectric ceramic platelet can be held firmly. However, the external dimension of the resonator is set at a value of greater than 30 times the plate thickness in order to improve the vibration energy trapping performance.

For example, a resonator for the frequency of 10 MHz has a thickness of about 0.13 mm and a diameter of about 3 mm, but a resonator for the frequency of 1 to 2 MHz has a thickness of 0.7 to 1.3 mm and a diameter of 20 to 30 mm, the increase in size being a feature of ceramic resonators. For this reason, ceramic resonators of the energy trapping type have been put into practical use only in the frequency of several MHz or more.

Figure 2:
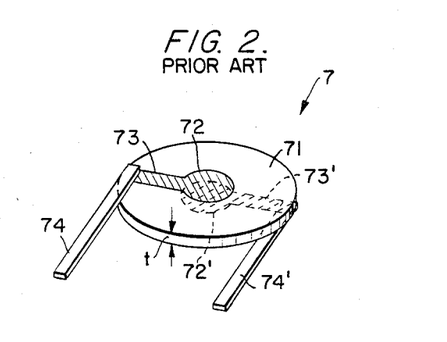
FIG. 2 is a perspective view of an existing resonator utilizing thickness-extensional vibration.

FIG. 2 is a perspective view of an example of a ceramic resonator 7 utilizing thickness-extensional vibration, wherein the metal thin film electrodes 72, 72' are formed by evaporation at the of both sides of the piezoelectric ceramic platelet 71; The edge of the piezoelectric ceramic platelet 71 is held by conductive metal holders 74, 74', which are connected to the metal thin film electrodes 72, 72' via the connecting belt electrodes 73, 73'. A greater part of the vibration energy is trapped within the area sandwiched by the opposing metal thin film electrodes 72, 72' with this configuration.

As explained above, the conventional ceramic resonator has the disadvantages that it becomes physically too small for the frequency of several hundreds kHz to several MHz, making manufacturing difficult or it becomes too large mismatching an LSI circuit etc. Moreover, a ceramic resonator of the contour vibration mode has not yet been put into practical use for high frequency bands because the reliability of the supporting means is insufficient.

A usual piezoelectric ceramic material used as a ceramic resonator has a Poisson's ratio of $\frac{1}{3}$ or less. Therefore, it is known that the ceramic resonator which consists of a rectangular piezoelectric ceramic platelet shows thickness-extensional vibration functions as a backward-wave-mode energy trapping resonator. The relation between the resonant frequency $f_0$ of extensional vibration and the size of this ceramic resonator is expressed by the equation (1).

$$f_0 = \{1/(2W_0)\} \cdot v \, [\text{Hz}] \tag{1}$$

Where, $W_0$ is width of resonator [m] and $v$ is extensional propagation velocity [m/s].

Figure 3:
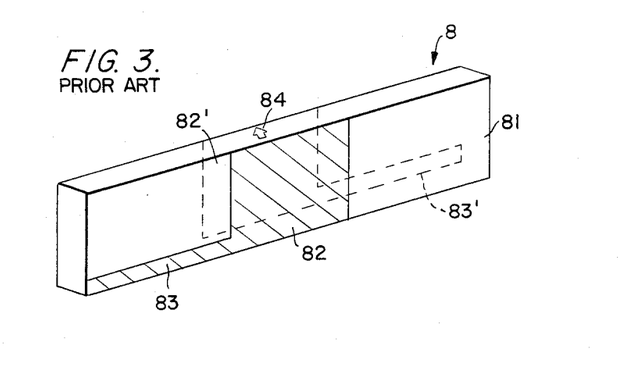
FIG. 3 is a perspective view of existing ceramic resonator utilizing width-extensional vibration.

FIG. 3 is a perspective view indicating the conventional structure of a ceramic resonator utilizing the thickness-extensional vibration of a piezoelectric ceramic platelet.

In this figure, 81 is a piezoelectric ceramic platelet, with a pair of thin film electrodes 82, 82' attached by evaporation etc. at the centers of the longitudinal direction. This ceramic resonator is fixed at its edge, in the longitudinal direction of the piezoelectric ceramic platelet, by a holding means not indicated, and an AC electric field is applied in order to drive the ceramic resonator via said holding means. Therefore, said electrodes 82, 82' are respectively provided with strip electrodes 83, 83' which are mutually extending toward different edges, as shown in this figure. The arrow mark 84 shows the polarization direction.

When an AC electric field is applied across the electrodes 82, 82', width-extensional vibration is excited by the piezoelectrical effect of the piezoelectric ceramic platelet. The ceramic resonator of FIG. 3 is an energy trapping type resonator based on the complex branches (Reference: US 78-63, Mar. 28, 1978, The Institute of Electronics and Communication Engineers of Japan, Technical Group on Ultrasonic) and the width-extensional vibration is trapped within the piezoelectric ceramic platelet area to which a pair of opposing electrodes are attached.

A ceramic resonator of the width-extensional vibration mode is thus realized and the manufacturing of the ceramic resonator shown in FIG. 3 will now be explained. First, the piezoelectric ceramic platelet 82 is of a specified size finished by grinding, etc., then thin film partial electrodes 82, 82' must be attached, for example, with the evaporation, to the main surfaces in the thickness direction as shown in FIG. 3. In order to obtain the partial electrodes, it is necessary to place a mask on the piezoelectric ceramic platelet 81 so that electrode is not attached to the unwanted area. But in this case, for the frequency of 2 MHz the piezoelectric ceramic platelet 81 measures about 0.2 mm in the thickness, about 0.9 mm in the width and about 15 mm in the length, therefore, it is very difficult to accurately place the mask within such dimensions. Upon completion of the electrode attaching operation, a polarization direction 84 is created by appying a DC voltage across opposing electrodes, thus a piezoelectric ceramic resonator 8 be obtained. Moreover, this ceramic resonator must be subjected to an adjustment of the resonant frequency in order obtain the desired characteristics.

Since the resonant frequency of width-extensional vibration is reversely proportional to the width of the resonator, the width of piezoelectric ceramic platelet is reduced by grinding etc. in order to adjustment the frequency. A ceramic resonator is usually required to have a frequency adjustment accuracy of 1 to $5 \times 10^{-}$, and the frequency is adjusted with the accuracy of 200 Hz to 1000 Hz for above ceramic resonator. Obtaining a grinding accuracy of 0.09 μm to 0.45 μm for the 2 MHz ceramic resonator which is required to have the above accuracy of grinding of the width dimension, is very difficult from the point of view of current grinding technique.

As explained above, an existing width-extensional resonator provides the feature of realizing a small size ceramic resonator for the frequency of several hundreds kHz to several MHz but is not economical because of the time required to manufacture and adjust the ceramic resonator by grinding of a high accuracy.

Only one ceramic resonator is discussed in above explanation, but a ceramic filter, combining a plurality of ceramic resonators, will be explained below.

Figure 4:
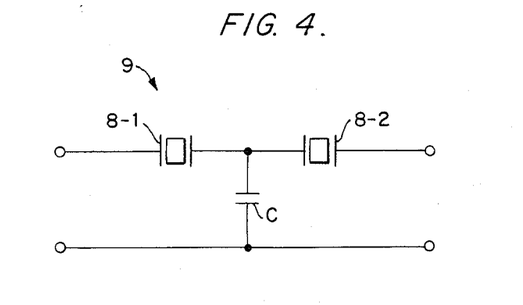
FIG. 4 is a schematic diagram of the configuration of a ceramic filter consisting of plurality of ceramic resonators.

FIG. 4 shows a structural example of a ceramic filter. In this figure, 8-1 and 8-2 are ceramic resonators and C is a capacitor.

As an energy trapping ceramic resonator, to be used as a ladder type ceramic filter 9 shown in FIG. 4, thickness-extensional resonator and thickness-shear resonators utilizing the thickness vibration of a platelet are usually employed. For example, regarding the above-mentioned thickness-extensional ceramic resonator, shown in FIG. 2, where the thin film electrodes 72, 72' are attached to both sides of the piezoelectric ceramic platelets 71 by evaporation in the thickness of t; the peripheral edge of piezoelectric the ceramic platelet 71 is held by a metal holding means 74, 74'; said thin film electrodes 72, 72' are connected to the strip electrodes 73, 73'; and a large amount of vibrational energy is trapped within the area sandwiched by thin film electrodes 72, 72', the resonant frequency of such a ceramic resonator is determined by the plate thickness as indicated by equations (2) and (3).

$$f_n = K_E/t_1 \times n [\text{Hz}] \quad (2)$$

$$f_m = K_S/t_2 \times m [\text{Hz}] \quad (3)$$

In these equations (2), (3), $f_n$ is the resonant frequency [Hz] of the thickness-extensional ceramic resonator, $f_m$ is the resonant frequency [Hz] of the thickness-shear ceramic resonator, $K_E$ is a constant [Hz m] determined by the material of the thickness-extensional ceramic resonator, $K_S$ is a constant [Hz m] determined by the material of the thickness-shear ceramic resonator, $t_1$ is thickness [m] of the thickness extensional ceramic resonator, $t_2$ is thickness [m] of the thickness-shear ceramic resonator, n and m are the degree (1, 3, 5, . . . ).

Namely, the resonant frequency of thickness-extensional ceramic resonator and thickness-shear resonator is inversely proportional to the thickness of plate.

In addition to such thickness-extensional ceramic resonators and thickness-shear ceramic resonators, the width-extensional resonator 8, shown in FIG. 3, which has alleviated the restriction on the selection of the dimension ratio of piezoelectric ceramic platelets and the selection of supporting means of the above resonators, is also considered as an energy trapping ceramic resonator 7 for use in the ladder type ceramic filter shown in FIG. 2.

Namely, existing ceramic filter have employed thickness-extensional ceramic resonator 8-1 or thickness-shear ceramic resonators 8-2 as the ceramic resonators 8 shown in FIG. 4.

Figure 5:
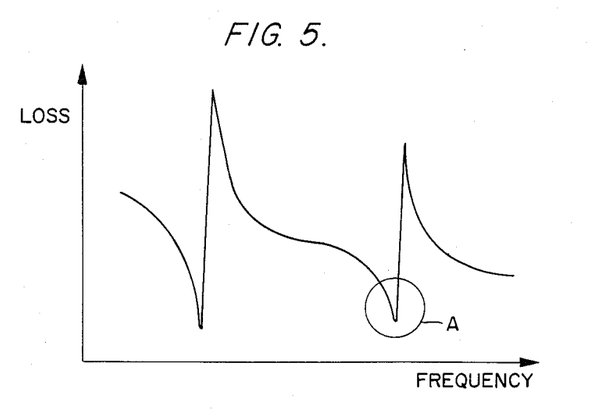
FIG. 5 is a diagram showing the frequency vs. loss characteristic of an existing ceramic filter.

However, existing ceramic filters have the following drawbacks. Existing ceramic filters utilizing the above thickness-extensional ceramic resonators, thickness-shear ceramic resonator and width-extensional ceramic resonators having the same plate thickness as the ceramic resonators 8-1 and 8-2 shown in FIG. 4. Therefore, if the main vibration of a ceramic resonator (for example, the thickness-shear basic wave) is used, the resonant frequency of each ceramic resonator becomes equal even in the high order mode (the 3rd, 5th mode of thickness-shear viabration), and the spurious response A appears in the attenuation band as shown in FIG. 5, deteriorating the out-band frequency loss characteristic. Namely, since the signal is not sufficiently lost in the attenuation band, an unwanted signal also exists, lowering the S/N ratio of the filter output signal and causing the performance of the communication equipment to be degraded. As a result, a ceramic filter is required to provide a circuit for suppressing spurious response A in the attenuation band of the output stage of the ceramic filter of FIG. 4, resulting in a disadvantage that the communication equipment becomes large in size.

Such a ceramic filter, having the structure combining plurality of these ceramic resonators, will be further explained from a different viewpoint.

Figure 6A:
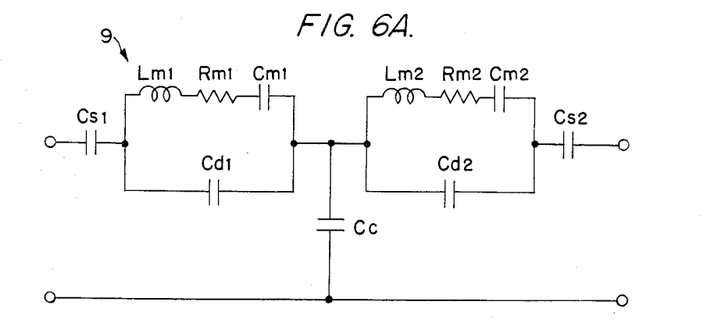
FIG. 6A is a diagram showing an equivalent circuit of a ceramic filter.

FIG. 6A is an equivalent circuit of the ceramic filter shown in FIG. 4.

Figure 6B:
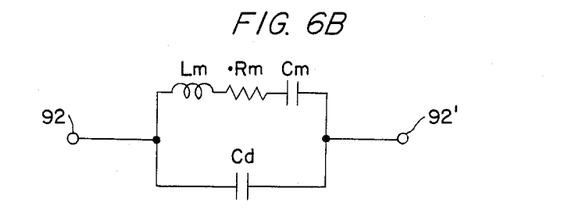
FIG. 6B is a diagram showing an equivalent circuit of a ceramic resonator.

In this case, the equivalent circuit of a ceramic resonator can be indicated by the circuit of FIG. 6B. In this figure, Cd is, for example, the damped capacitance of the piezoelectric ceramic platelet 81 of FIG. 3 as the dielectric material, and a series circuit of Lm-Rm-Cm indicates electrical energy and mechanical energy generated by vibration. Namely, an equivalent circuit, shown in FIG. 6B, can be obtained through the generation of width-extensional vibration by applying an AC electric field across the electrodes 82, 82'.

However, the configuration of a ceramic filter using an existing ceramic resonator is always accompanied with following disadvantages.

Namely, a ceramic filter is generally expressed with an equivalent circuit shown in FIG. 6A, but the configuration of a ceramic filter indicated by the equivalent circuit shown in FIG. 6A using a ceramic resonator shown in FIG. 3 requires three capacitors corresponding to $C_{s1}$, $C_{s2}$, $C_c$ in the equivalent circuit shown in the figure, thus resulting in increase of number of component elements and resultant physical enlargement.

Moreover, a ceramic resonator, shown in FIG. 3, also provides the disadvantage that manufacturing and adjustment require highly accurate grinding work, requiring a long time and a resulting loss in economization. For this reason, if a ceramic filter is configurated using such a ceramic resonator, it becomes considerably expensive.

SUMMARY OF THE INVENTION

It is an object of the present invention to provide a highly reliable energy trapping ceramic resonator which operates at the frequency from several hundreds kHz to several MHz.

It is another object of the present invention to provide an economical and high performance ceramic resonator assuring characteristics such as being small in size for the frequency band from several hundreds kHz to several MHz and being easy manufacturing and adjustment.

It is a further object of the present invention to provide, in view of eliminating conventional disadvantages, a high performance ceramic filter which suppresses the out-band frequency response allows removal of the circuit for suppressing spurious response in the attenuation band, provides a ceramic filter using fewer circuit elements and is very economical.

The subject matter of the present invention, in order to attain such objects, is a configuration of a ceramic resonator where the width of center part, in the longitudinal direction of the piezoelectric ceramic plate, is narrower than the width of the ends and polarization in the thickness direction is carried out at least to said narrow width portion metal thin film electrodes formed on the entire part of both main surfaces of said piezoelectric ceramic platelet are respectively separated in the width direction at opposite ends of said narrow width area and sandwiching it, as a third electrode separated from said first electrode on one main surface and a fourth electrode separated from said second electrode on the other main surface. A constant vibration, based on said narrow width region, is generated at the narrow width part when an electrical signal is applied to the ceramic resonator. The narrow width part is an indentation formed in any one of the width directions. Or, the narrow region can be formed with indentations on both sides. In addition, the polarization in the thickness direction is the same for the entire longitudinal direction of said piezoelectric ceramic platelet. The first electrode and the fourth electrode, and the second electrode and the third electrode are connected at a terminal. The ceramic resonator provides a damping material which is provided at the surface of the least width direction of the edge of said piezoelectric ceramic platelet and suppresses spurious responses.

A combination of a plurality of selected modifications of the ceramic resonator forms a ceramic filter where a plurality of ceramic resonators are connected in series, and as a modification of the ceramic filter, the thickness of at least one resonators, in the plurality of ceramic resonators, is substantially different from the thickness of the other resonators. Moreover, the series connection is a capacitive connecting part, connected in parallel. Moreover, a ceramic filter of the present invention provides a structure where two resonators are considered respectively as the first and second resonator and where the connection of the first and second resonators in accomplished by connecting the responsive first and fourth electrodes. The connected fourth electrode connecting part is considered as the common end, one third electrode is considered as the input end, and the other third electrode is considered as the output end.

BRIEF DESCRIPTION OF THE DRAWINGS

FIG. 20A is a plan view of a ceramic resonator used in a different ceramic filter of the present invention, while

FIG. 21A is a perspective view of the ceramic filter connecting structure, while

In these figures, reference numerals 1, 1-1 to 1-8, 2, 6, 7, 8, 8-1, 8-2 are ceramic resonators; 3, 4, 9 represent ceramic filters using a plurality of ceramic resonators; 10, 20, 61, 71, 81 are piezoelectric ceramic platelets; 11a to 11d, 21a, 21b, 62, 62', 71 to 73', 82, 82' are electrodes; 12a, 12b, 12ad, 12bb, 12bc, 42 are terminals; 13a, 13b, 23b are separators; 14, 14', 24 are arrow marks indicating the polarizing direction; 15, 25, 66, 66' are insulating substrates; 16a, 16b, 26a, 26b are conductive adhesives; 17a, 17b, 27a, 27b are supporters; 18a, 18b are dumping materials; 41 is connecting line.

DESCRIPTION OF THE PREFERRED EMBODIMENTS

The preferred embodiments of the invention will be explained in detail, upon reference to the drawings.

Figure 7:
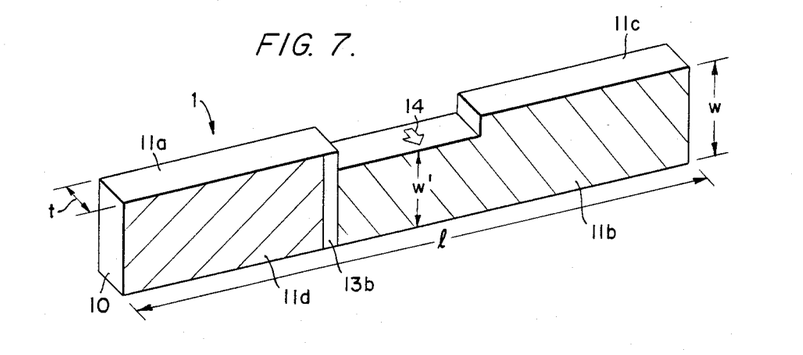
FIG. 7 is a perspective view of a first embodiment of the present invention.
Figure 8:
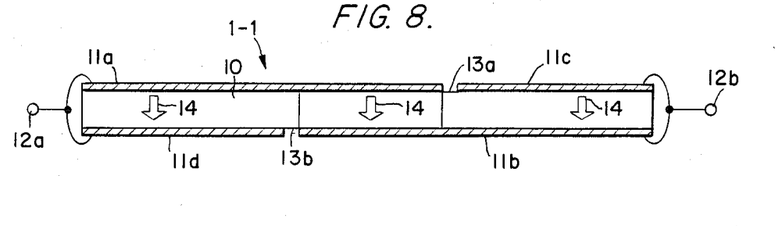
FIG. 8 is a plan view of the perspective views of embodiments of the present invention.

FIG. 7 and FIG. 8 show the perspective view and plan view of an embodiment of the ceramic resonator of this invention. Particularly, FIG. 7 shows the basic outline view. The piezoelectric ceramic platelet 10 of the ceramic resonator 1 measures t in thickness, 1 in length and W in width, with an indentation at its center so that its width W' is narrower than the width, W, of both ends. Numerals 11a to 11d represent metal thin film electrodes formed on both main surfaces thereof by evaporation. 12a, 12b are terminals; 13a, 13b are separations in the electrodes where the metal thin film was removed. 14 is an arrow mark indicating the polarization direction. The narrow part of piezoelectric ceramic platelet 10 is sandwiched by a part of the electrodes 11a, 11b. When a voltage is applied to the terminals 12a, 12b, the potentials across electrodes 11a, 11d and electrodes 11b, 11c become equal but a electric field is applied to the narrow part between the electrodes 11a and 11b. Electrode 11a is called the first electrode, 11b the second electrode, 11c the third electrode, 11d the fourth electrode.

The piezoelectric ceramic material used for ceramic resonator generally has a Poisson's ratio of $\frac{1}{3}$ or less and it means that said ceramic resonator is the backward-wave-mode energy trapping resonator as in the case of the equation (1).

In the present invention, since the width W' of the central area is narrower than the width W at both ends, as will be understood from the equation (1), the resonant frequency $f_1$ of the width-extensional vibration at the central area becomes higher than the resonant frequency $f_2$ of the width-extensional vibration at the ends. Moreover, since the opposing electrodes namely the first electrode 11a and the fourth electrode 11d, and the second electrode 11b and the third electrode 11c are respectively terminated at both ends, the elastic constant becomes small because of the piezoelectric reaction and thereby the extensional propagation velocity v becomes low and the resonant frequency $f_2$ at both ends further becomes low. Therefore, when an AC voltage is applied to the terminals 12a, 12b, an AC electric field is also applied to the narrow area at the central area and the width-extensional vibration is generated by the piezoelectrically unstiffened effect.

Since the resonant frequency at both ends is lower than that of the vibration excited in the narrow area, a propagation constant can be indicated by an imaginary number and the vibration propagated to both ends is attenuated. As a result, the vibration energy excited by the applied AC electric field is concentrated in the narrow area at the center and thereby a so-called energy trapping resonator can be obtained.

As explained above, vibration energy is concentrated in the narrow area at the central point, thus, vibration displacement at both ends becomes zero, making it possible to hold such a resonator by the end portion. Thereby reliability due to interference from external vibration can be increased.

As a practical example, when the frequency is 2 MHz the following data can be obtained; namely t=0.1 to 0.3 mm, l=7 to 13 mm, W≃1 mm, W'≃0.9 mm. With such dimensions, a resonator can be manufactured easily. In addition, since the width W' of the narrow area formed in order to obtain the desired resonant frequency can be easily set to the desired value by forming an indentation by grinding etc., resonator for dealing with frequencies from several hundreds kHz to several MHz can be manufactured very easily. Since simultaneous manufacture of a plurality of piezoelectric ceramic platelets 10 is also easy, manufacturing costs can also be reduced.

Figure 9:
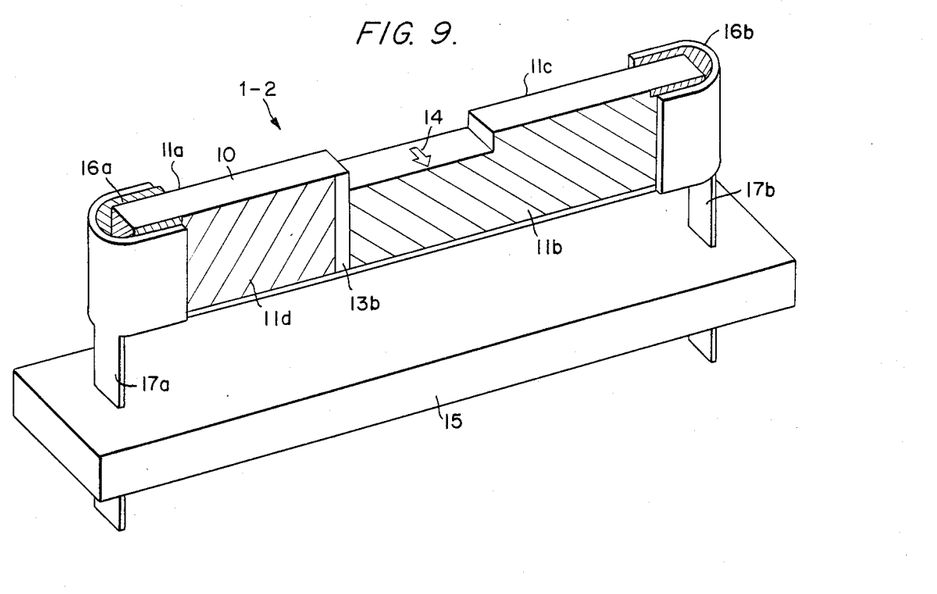
FIG. 9 is a perspective view of the second embodiment of the present invention.

FIG. 9 is a perspective view of a practical structure, in the desired condition, of the preferred embodiment of a ceramic resonator of the present invention. The same reference numbers as those in FIG. 7 and FIG. 8 show the same portions, and 15 is an insulating substrate; 16a, 16b are conductive adhesives, 17a, 17b are supporting means consisting of conductive metal materials. These supporting means 17a, 17b are fixed to the insulating substrate 15. The end portion of the supports are curved like a letter U in order to hold the piezoelectric ceramic platelet 10 through the conductive adhesive 16a, 16b. The support ends connect the first and fourth electrodes, 11a and 11d, and the second and third electrodes, 11B and 11C, thus forming the terminals 12a and 12b respectively shown in FIG. 8. Namely, the vibration displacement at both ends of the resonator becomes zero, allowing rigid holding thereof and the opposing terminals are connected through U-shaped portion. The supporting means can, of course, be obtained not only by the embodiment shown in FIG. 9, but also by employing other structures of supporting means.

Figure 10:
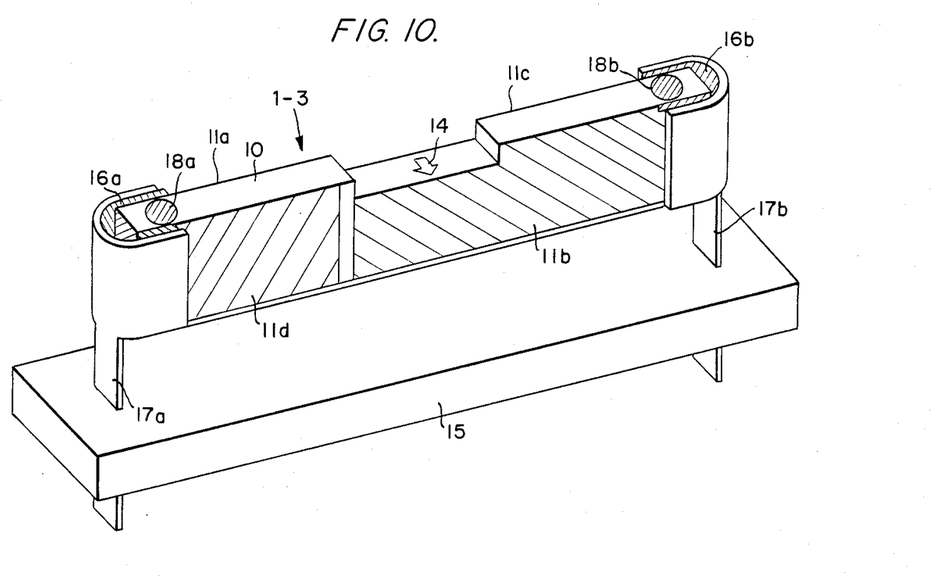
FIG. 10 is a perspective view of the third embodiment of the present invention.

FIG. 10 is a perspective view of another embodiment of the present invention. The same reference numbers as those in FIG. 9 indicate the same portions and 18a, 18b are dumping material. An AC electric field applied to the narrow area causes the width-extensional vibration. The piezoelectric ceramic platelet 10, however, also generates a vibration, by the piezoelectrically unstiffened effect, in the longitudinal direction and this vibration further causes a width flexure vibration depending on the conditions at both ends and thereby spurious responses are generated in the frequency near the resonant frequency of the extensional vibration in the width direction of the main vibration.

Figure 11:
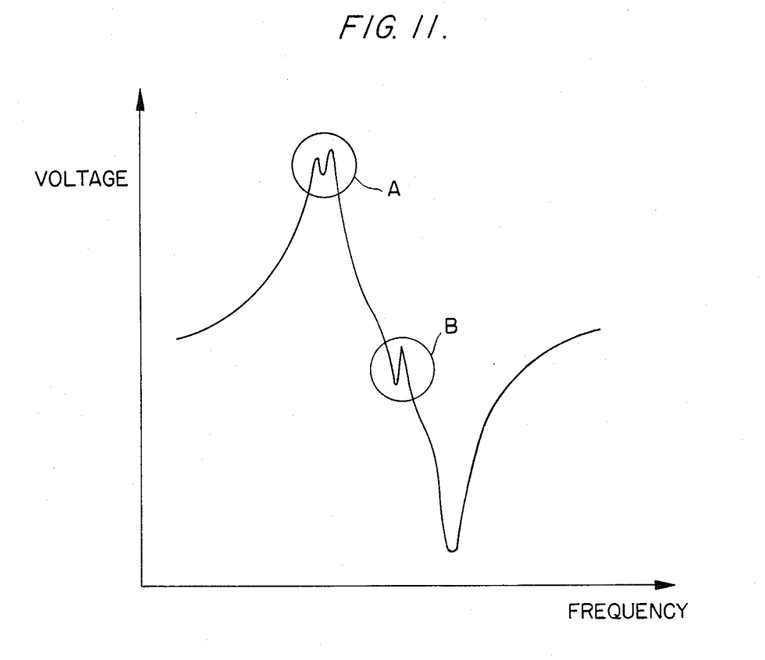
FIG. 11 and FIG. 12 is a diagram showing response curves.

FIG. 11 shows the frequency response of the above embodiment shown in FIG. 9. In this figure, A, B show the spurious responses caused by the abovementioned flexure vibration which can be suppressed without any influence on the width-extensional vibration of the main vibration.

Figure 12:
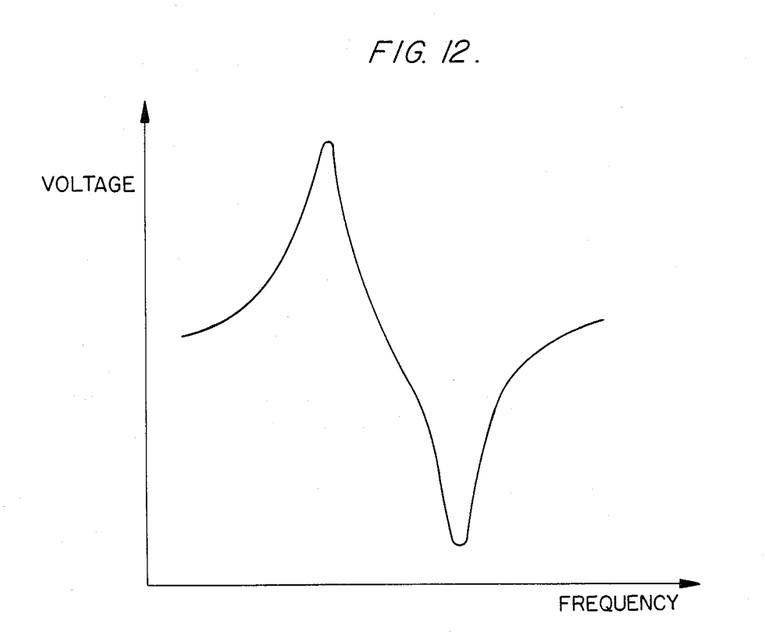

FIG. 12 shows the frequency response of the embodiment shown in FIG. 10 providing the damping materials 18a, 18b. In this figure, the spurious responses A, B in FIG. 11 do not appear at all.

As the damping material 18a, 18b, materials showing a large acoustic loss, for example, a resin of the epoxy system can be used. The damping material can be used at not only the upper part of both ends of piezoelectric ceramic platelet 10, but also at the lower part of it, thereby causing further improvement.

Figure 13:
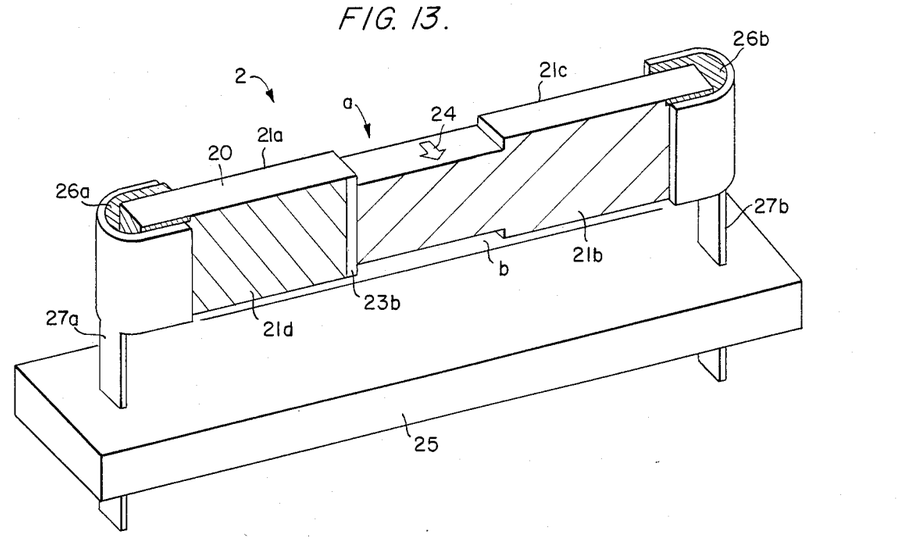
FIG. 13 is a perspective view of the fourth embodiment of the present invention.

FIG. 13 is a perspective view of a further embodiment of the present invention. In this figure, numeral 20 represents a piezoelectric ceramic platelet; numeral 21b, 21d represent the second and fourth electrodes; numeral 23b represents a separator; numeral 24 represents an arrow mark indicating the polarization direction; numeral 25 represents an insulating substrate; numeral 26a, 26b represents conductive adhesives; and numerals 27a, 27b represents metal supporing means. The piezoelectric ceramic platelet 20 is provided with indentation areas a and b at its upper and lower surfaces, forming the narrow area at the central part of platelet 20. The second and fourth electrodes 21b, 21d correspond to the second and fourth electrodes 11b, 11d of the abovementioned embodiment and the electrodes 21a, 21c corresponding to the first and third electrodes 11a, 11c are provided at the opposite side. Formation of the indentations a, b allows only a pure vibration in the longitudinal direction without the generating of the flexure vibration because the piezoelectric ceramic platelet 20 has a symmetrical structure. As a result, the spurious responese resulting from the flexure vibration disappear at the area near the width-extensional vibration frequency of the main vibration and a frequency response which is almost the same as that shown in FIG. 12 can be obtained. Here, it is also possible to suppress the remaining flexure vibration component caused by errors in the indentations a, b, by providing a dumping material as in the embodiment shown in FIG. 10.

As explained previously, a ceramic resonator of this invention comprises a piezoelectric ceramic platelet 10 or 20 which is polarized, as a whole, in the thickness direction and provides a narrow area, at the central area in the longitudinal direction, the width W' of the portion being narrower than the width W of both ends. The first, second, third and fourth electrodes 11a to 11d can be obtained by separating the metal thin film formed by the evaporation, on both sides of said piezoelectric ceramic platelet, by the separations 13a and 13b in such a manner as to sandwich the narrow area at the different positions in the longitudinal direction. The terminals 12a, 12b connect the opposing first and fourth electrodes 11a, 11d and the second and third electrodes 11b, 11c at both ends in the longitudinal direction. When an AC electric field is applied across the terminals 12a, 12b, it is also applied to the narrow area, causing the width-extensional vibration; the extensional vibration generated at the central area is attenuated at both ends even when it is propagated thereto and thereby such ceramic platelet can be supported firmly by such terminals 12a, 12b.

Figure 14A:
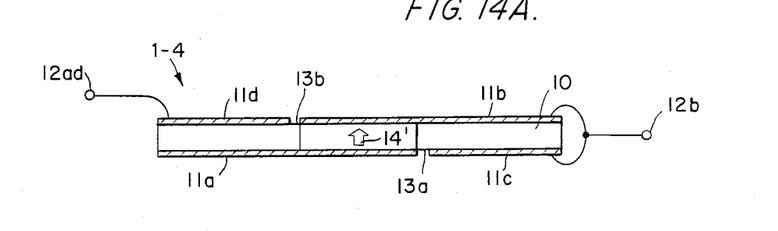
FIG. 14A is a plan view of the fifth embodiment of the present invention.
Figure 14B:
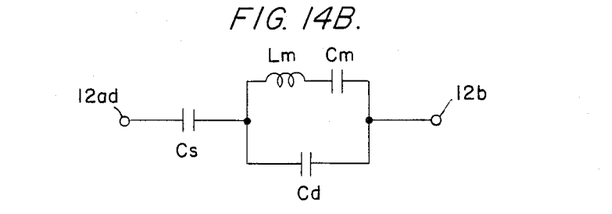
FIG. 14B is an equivalent circuit thereof.

FIG. 14A and FIG. 14B show different embodiments of a ceramic resonator of this invention. FIG. 14A shows a top view similar to that of FIG. 8, while FIG. 14B shows an equivalent circuit thereof.

In these figures, numeral 10 represents a piezoelectric ceramic platelet having the structure with so-called level-different narrowed area at the central area where the width is narrower than that of both ends in the longitudinal direction. Numerals 11a to 11d represent the first through fourth thin film electrodes attached to the main surface of piezoelectric ceramic platelet in the thickness direction, where the first electrode 11a and the third electrode 11c are separated at the one end of said level-different narrowed area (13a). Moreover, the second electrode 11b and fourth electrode 11d are also separated at the other end of said level-different narrowed area (13b). The second electrode 11b and the third electrode 11c are connected at the end via the holding means not illustrated and it is also used as the one external lead 12b.

The fourth electrode 11d is also connected to the holding means not illustrated and is used as the other external lead 12ad. In this case, the first electrode 11a is not connected to any holding means as explained above. If the holding means connecting the fourth electrode 11d is likely to come into contact with the first electrode 11a, the first electrode 11a near the holding means may partly be removed. 14' shows the polarization direction and polarization is carried out only in the narrowed area at the central area.

Operation of a ceramic resonator 1-4 of the present invention as shown in FIG. 14A is explained below. When an AC electric field is applied across the terminals 12ad, 12b, an electric field is applied to the narrow area via the fourth electrode 11d and the first electrode 11a and the width-extensional vibration is generated by the piezoelectric effect at the narrow area at the central part of the platelet where the polarization is carried out.

Since polarization does not occur in the piezoelectric ceramic platelet 10 between the first electrode 11a and the fourth electrode 11d, the piezoelectric ceramic platelet of this part functions only as a dielectric. Therefore, the part between 11a and 11d operates only as a capacitance.

Cs shown in the equivalent circuit of FIG. 14B is a capacitance between said first and fourth electrodes 11a, 11d.

The manufacturing steps of the ceramic resonator of this invention now will be explained. After grinding a piezoelectric ceramic platelet into the desired thickness for a ceramic resonator, a thin film electrode is deposited on the entire main surface in the thickness direction by evaporation, thereby completing a piezoelectric ceramic platelet wafer. Succeedingly, a ceramic chip is formed by cutting the ceramic resonator in the desired width and length from such wafer, and a plurality of these chips are layered, followed by the process for making narrow the width of the central part in the longitudinal direction as shown in FIG. 7 and FIG. 13, thus completing a ceramic resonator.

In the case of the ceramic resonator of this condition, with the electrode attached to the entire part of the main surface in the thickness direction, this electrode is divided using a laser or the like at the level-different narrowed area as shown in FIG. 7, FIG. 8 and FIG. 13, forming the separators 13a, 13b, 23a, 23b. In addition, polarization is carried out by applying a high DC voltage across the first and second electrodes 11a, 11b as shown in FIG. 14A. FIG. 7 shows the condition before separating the electrode and a high voltage is applied across the electrodes of both main surfaces.

As explained above, the ceramic resonator of this invention is well suited for the mass-production process by batch processing, thereby improving manufacturing efficiency and economization.

Moreover, the resonant frequency of ceramic resonators of this invention can be adjusted by grinding the width of the ceramic resonator as in the case of the existing resonator and also by changing Cs in the equivalent circuit shown in FIG. 14B.

Namely, in the equivalent circuit of FIG. 14B, its resonant frequency f is expressed by the following equation.

$$f = \frac{1}{2\pi}\sqrt{\frac{1}{Lm \times \frac{1}{\frac{1}{Cm} + \frac{1}{Cd(1+a)}}}}$$

Where, $a = Cs/Cd$. The value of Cs can also be changed by trimming the fourth electrode 11d or the first electrode 11a opposing the fourth electrode 11d.

As mentioned above, the frequency of a ceramic resonator of this invention can be adjusted by grinding the width of ceramic resonator or by changing a value of Cs. Therefore, if a large amount of adjustment is necessary, a pair of methods are combined as indicated below. Namely, at first the grinding is carried out, such as by a grinder machine, and then the value of Cs is adjusted for high precision adjustment. Consequently, high speed and high accuracy adjustment can be realized very easily, with economization of a ceramic resonator.

The trimming for the electrode 11a or 11d can be done easily and accurately through irradiation of laser beam for industrial use but it can be done, of course, by other adequate means.

Then, an embodiment of a ceramic filter composed of a combination of ceramic resonators is explained below, in place of one ceramic resonator associated with this invention.

Figure 15:
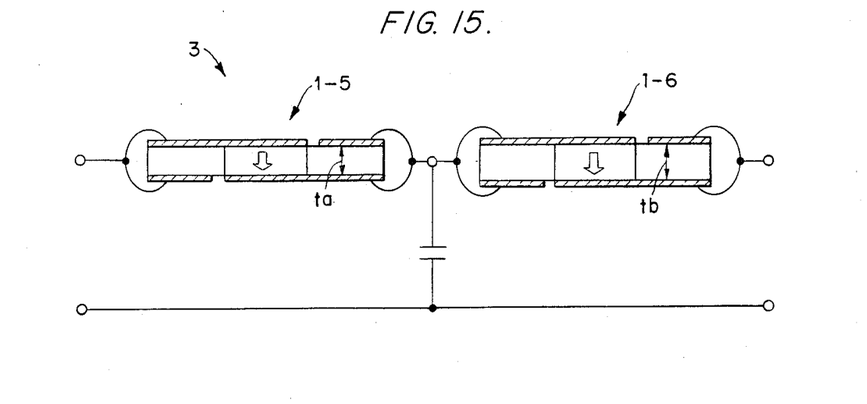
FIG. 15 is a plan view of a ceramic filter where two ceramic resonators of the present invention are connected.

FIG. 15 shows such an embodiment, where a pair of ceramic resonators 1-5, 1-6 are connected in series with the thickness of piezoelectric ceramic platelets considered respectively as $t_a$ and $t_b$. Referring to this figure, an embodiment of a ceramic filter associated with this invention will be explained using FIG. 16 to FIG. 19.

Figure 16:
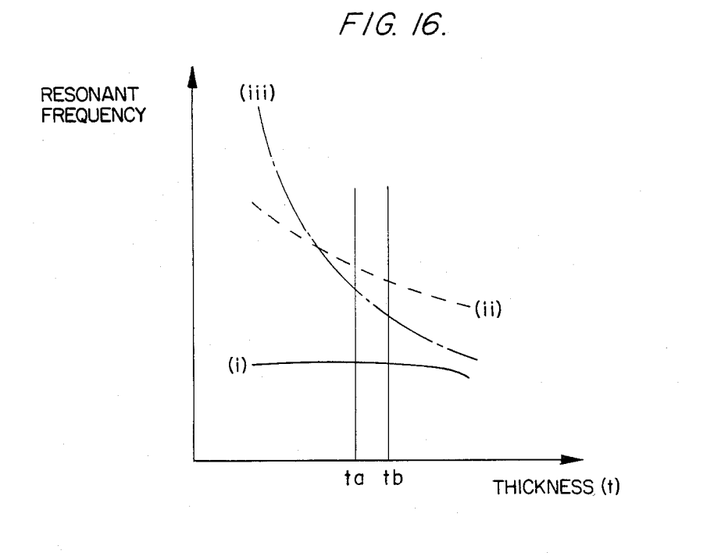
FIG. 16 is a diagram showing the plate thickness vs. resonant frequency characteristic curves for the width-extensional ceramic resonator and thickness-extensional ceramic resonator.

FIG. 16 shows a thickness vs. resonant frequency characteristic of a width-extensional ceramic resonator. In this figure, the horizontal axis indicates thickness of the ceramic resonator, the vertical axis indicates resonant frequency of the ceramic resonator, a solid line (i) shows the basic wave characteristic of width-extensional vibration, a broken line (ii) indicates 3rd order mode characteristic of width-extensional vibration and a dot-and-dash line indicates the basic wave characteristic of thickness-extensional vibration.

Figure 17:
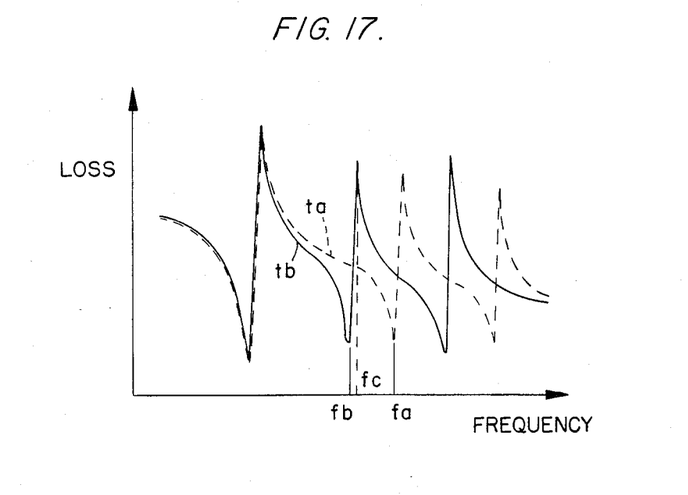
FIG. 17 is a diagram showing a frequency vs. loss characteristic of the width-extensional ceramic resonator.

FIG. 17 shows the frequency vs. loss characteristics of a width-extensional ceramic resonator. In this figure, the horizontal axis indicates frequency, the vertical axis indicates the loss, a broken line indicates characteristics of a width-extensional ceramic resonator with thickness of $t_a$ and a solid line indicates the characteristics of a width-extensional ceramic resonator with thickness of $t_b$.

Figure 18:
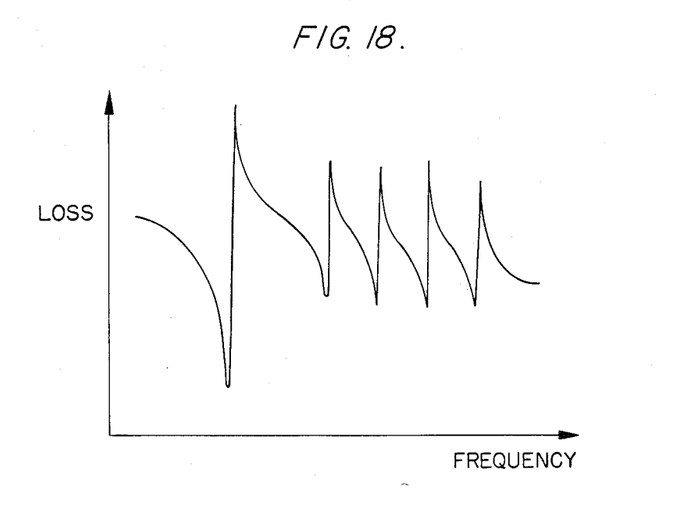
FIG. 18 is a diagram showing the a frequency vs. loss characteristic of an embodiment of a ceramic filter shown in FIG. 15.

FIG. 18 shows the frequency vs. loss characteristics of the embodiment of a ceramic filter associated with this as shown in FIG. 15.

In this figure, the horizontal axis indicates frequency, while the vertical axis indicates loss.

Figure 19:
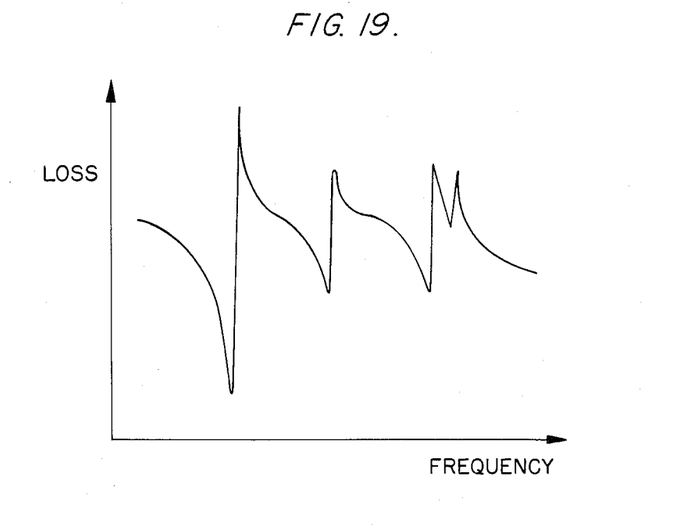
FIG. 19 is a diagram showing the frequency vs. loss characteristic of a ceramic filter shown in FIG. 15.

FIG. 19 shows a frequency vs. loss characteristic of the same embodiment of a ceramic filter associated with this invention, namely that of FIG. 15. In this figure, the horizontal axis indicates frequency while the vertical axis indicates loss.

A ceramic filter associated with this invention uses a pair of width-extensional ceramic resonators of different thicknesses as shown in FIG. 15. Namely, as a ceramic filter 3 in the ladder configuration, the ceramic resonators 1-5, 1-6 with respectively different thicknesses are used.

A width-extensional ceramic resonator shows the characteristics where resonant frequency changes as shown in FIG. 16 when width of resonator is kept constant and thickness is gradually changed. Namely, the resonant frequency of the fundamental mode of a width-extensional vibration of a width-extensional ceramic resonator shows a little change because it is almost completely determined by the width with only a small influence on the shape ratio caused by the width (W of FIG. 7) of the resonator and thickness (t of FIG. 7). But, the 3rd order mode of width-extensional vibration is influenced by the shape ratio and the resonant frequency of the thickness-extensional vibration is reversely proportional to thickness. Consequently, when the thickness of a resonator (t of FIG. 7) is changed, the resonant frequency changes to a large extent.

For example, in a comparison between a width-extensional ceramic resonator having thickness $t_a$ and a width-extensional ceramic resonator having thickness $t_b$, as shown in FIG. 17, the resonant frequency is almost equal in the main vibration (fundamental mode of width-extensional vibration), but the resonant frequency of the 3rd mode is $f_a$ for the width-extensional ceramic resonator with thickness $t_a$ or $t_b$ for the width-extensional ceramic resonator with thickness $t_b$. In addition, in the fifth order mode or in the succeeding modes, the resonant frequency is also different. As explained, the resonant frequency in the vibrations other than the main vibration is largely different for the width-extensional ceramic resonators with thickness of $t_a$ and $t_b$.

If width-extensional ceramic resonators with thicknesses $t_a$ and $t_b$ are used respectively as the ceramic resonators 1-5, 1-6 of the ladder type ceramic filter shown in FIG. 15, the frequency vs. loss characteristic of a ceramic filter as shown in FIG. 18 can be obtained. Namely, when the width-extensional ceramic resonators in different thicknesses are used for the ladder type ceramic filter, a large out-band loss can be obtained since the resonant frequencies of vibrations other than the main vibration of each width-extensional ceramic resonator are different, and as a result, the out-band spurious response can be made small.

Namely, a ceramic filter associated with this invention suppresses out-band spurious responses by using the width-extensional ceramic resonators in the different thicknesses in the existing ladder type circuit shown in FIG. 4. Explained here is a ceramic filter of ladder type shown in FIG. 15 where a pair of width-extensional ceramic resonators in different thicknesses are used, but a ladder type ceramic filter using two or more width-extensional ceramic resonators can also suppress out-band spurious responses. In this case, the relation between the thicknesses of each width-extensional ceramic resonators is as follows: namely, only a change of the thickness of at least one width-extensional ceramic resonator, among a plurality of width-extensional ceramic resonators is required.

When the frequency $f_c$ of a width-extensional ceramic resonator having a thickness of $t_a$ shown in FIG. 17 is matched to the frequency $f_a$ of a width-extensional ceramic resonator having a thickness of $t_b$ by controlling the thicknesses $t_a$ and $t_b$ of each width-extensional ceramic resonators, deterioration of the frequency vs. loss characteristics due to resonance of the width-extensional ceramic resonator having thickness $t_b$ is suppressed by the anti-resonance of a width-extensional ceramic resonator having the thickness $t_a$. Thereby, a ceramic filter showing the frequency vs. loss characteristics shown in FIG. 19 can be obtained. Namely, as shown in FIG. 19, the out-band spurious response is effectively suppressed and the frequency vs. loss characteristics can be improved more effectivly by matching the resonant frequency of the 3rd order mode of the width-extensional ceramic resonator having the thickness $t_b$ to the anti-resonance frequency of the 3rd order mode of width-extensional ceramic resonator having the thickness $t_a$.

Namely, when a ladder type ceramic filter uses a plurality of width-extensional ceramic resonators having different thicknesses and the condition of thickness of each width-extensional ceramic resonator is established (namely when the resonant frequency of 3rd order mode of a certain width-extensional ceramic resonator matches the anti-resonant frequency of the 3rd mode of other width-extensional ceramic resonators), the frequency vs. loss characteristics can be improved.

Another embodiment of a ceramic filter comprising a plurality of ceramic resonators is explained below.

Figure 20A:
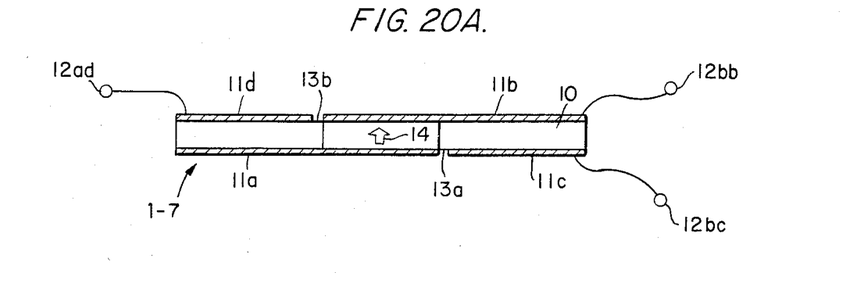
Figure 20B:
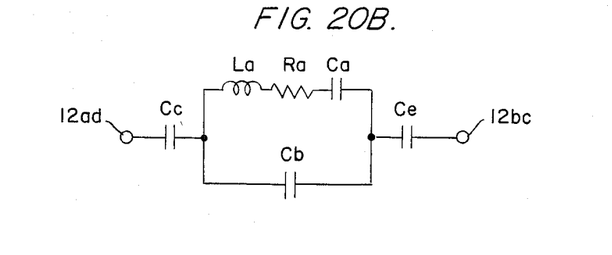
FIG. 20B is a diagram showing an equivalent circuit thereof.
Figure 21A:
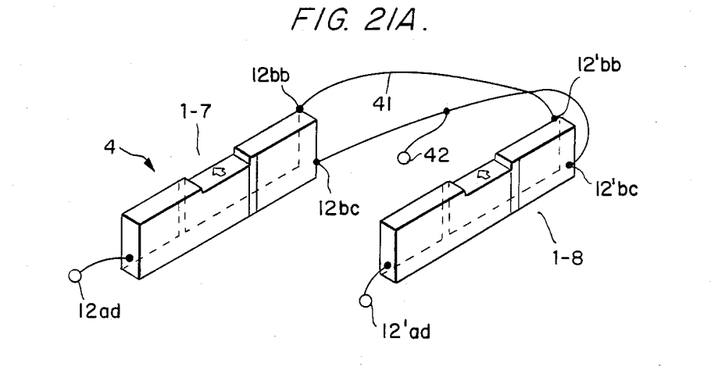
Figure 21B:
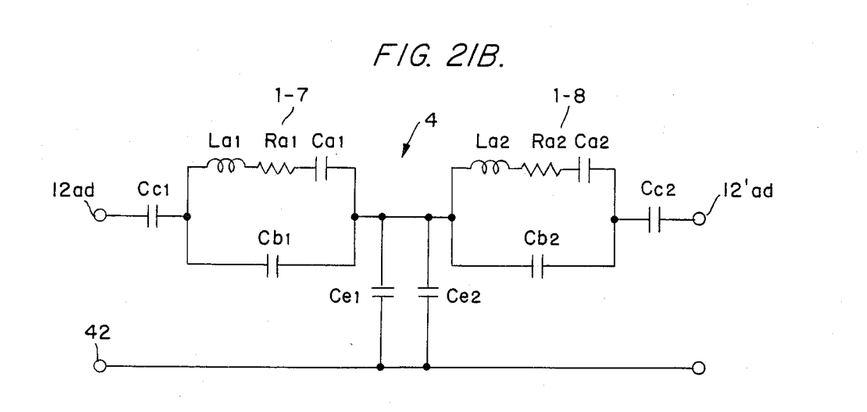
FIG. 21B is a diagram showing an equivalent circuit thereof.

FIG. 20 and FIG. 21 show another embodiment of a ceramic filter associated with this invention. FIG. 20A is a plan view of a ceramic resonator used in the ceramic filter associated with this invention, while FIG. 20B shows an equivalent circuit of a ceramic resonator. In this figure, 11a and 11d represent the first to fourth electrodes; 14 represents the polarization direction; 10 represents the piezoelectric ceramic platelet; 13a and 13b represent separators; 12ad represents the connecting terminal of the fourth electrode 11d; 12bb represents the connecting terminal of the second electrode 11b; 12bc represents the connecting terminal of the third electrode 11c.

FIG. 21A is a perspective view of a ceramic filter and FIG. 21B is an equivalent circuit of said ceramic filter. In these figures, 1-7 and 1-8 represent ceramic resonators. These resonators respectively have performed the polarization only in the narrow area of the central area.

When an AC electric field is applied across the terminals 12ad and 12bc of the ceramic resonator 1-7 shown in FIG. 20A, an electric field is applied to the level-different narrow area via the electrodes 11a and 11b and the width-extensional vibration is generated by the piezoelectrically unstiffened effect at the narrowed area of the central area where polarization is already carried out.

Since polarization has not been carried out to the piezoelectric ceramic platelet 10 between the electrodes 11a and 11d, and between the electrodes 11b and 11c, the piezoelectric ceramic platelet of this portion functions only as a dielectric. Thereby, the ceramic platelet between the electrodes 11a and 11d and between the electrodes 11b and 11c function only as the capacitors.

Therefore, an equivalent circuit of the ceramic resonator shown in FIG. 20A can be expressed by the circuit shown in FIG. 20B. Namely the capacitor functioning between the electrodes 11a and 11d corresponds to $C_c$ of FIG. 20B, while the capacitor functioning between the electrodes 11b and 11c corresponds to $C_e$ of FIG. 20B. The narrowed area at the central portion where polarization is carried out is expressed by the parallel connection of the series circuit of La-Ra-Ca and Cb by the piezoelectric ceramic platelet 10 at the narrowed area of central portion, and by the width-extensional vibration.

The structure shown in FIG. 21A is employed by using a pair of ceramic resonators. Namely, terminal 12bb of ceramic resonator 1-7 and the terminal 12'bb of the ceramic resonator 1-8 are connected by a line 41, and terminal 12bc of the ceramic resonator 1-7 and terminal 12'bc of the ceramic resonator 1-8 are connected, providing the terminal 42. When an AC electric field is applied across the terminals 12ad and 42, an equivalent circuit indicated by $C_{c1}$, $L_{a1}$, $R_{a1}$, $C_{a1}$, $C_{b1}$, $C_{e1}$ shown in FIG. 21B appears by the ceramic resonator 1-7, while an equivalent circuit indicated by $C_{e2}$, $L_{a2}$, $R_{a2}$, $C_{a2}$, $C_{b2}$, $C_{c2}$ appears, by the ceramic resonator 1-8.

Namely, the equivalent circuit shown in FIG. 21B can be obtained by forming the ceramic filter shown in FIG. 21A.

Thus, the equivalent circuit similar to that shown in FIG. 1 can be obtained. Here, in comparison with the equivalent circuit of FIG. 6A, $C_{sl}=C_{c1}$, $L_{ml}=L_{a1}$, $R_m=R_{a1}$, $C_{ml}=C_{a1}$, $C_{dl}=C_{b1}$, $C_c=C_{e1}+C_{e2}$, $L_{m2}=L_{a2}$, $R_{m2}=R_{a2}$, $C_{m2}=C_{a2}$, $C_{d2}=C_{b2}$, $C_{s2}=C_{c2}$.

As explained in detail, according to the ceramic filter of this invention, a ceramic filter can be formed with a pair of ceramic resonators, showing an effective simplification of the structure. Moreover, fewer circuit elements and the decreased number of manufacturing steps for ceramic resonators contributes to economization. In this case, the ceramic resonator may employ the basic structure shown in FIG. 7 or that shown in FIG. 13.

As explained above in detail, the resonant frequency of a ceramic filter using a ceramic resonator of the present invention is determined by the width W' of the narrowed area and a filter for the frequency band from several hundreds kHz to several MHz can be made easily. Moreover, the resonators can be firmly held. Thereby, a very economical and highly reliable ceramic resonator can be provided.

If flexure vibration occurs depending on the conditions of the edges of the piezoelectric ceramic platelet, such flexure vibration can be suppressed by providing the dumping materials 18a, 18b and the spurious generating at the frequency near the width-extensional vibration frequency of the main vibration can also be suppressed. Restrictions on selecting sizes of piezoelectric ceramic platelets and supporting means can be eased.

Flexure vibration can be suppressed by forming the narrowed portion through symmetrical generation of the indentations at the upper and lower sides in the central portion of the piezoelectric ceramic platelet in the longitudinal direction. Such a symmetrical structure causes normal longitudinal vibration without any component of flexure vibration.

A ceramic resonator associated with this invention is suitable for mass-production and allows fine adjustments with high accuracy. Thereby, small size and economical ceramic resonators can be realized, resulting in a large contribution to industry.

A ceramic filter associated with this invention is capable of improving the frequency vs. loss characteristic by only using width-extensional ceramic resonators in different thicknesses, and thereby raising the S/N ratio of the filter output signals, easily bringing about high performance which was not been obtained with existing ceramic filters. Such a ceramic filter associated with this invention shows effectiveness in the improvement of performance, reduction in size and economization of a variety of communication systems. Particularly when a plurality of such resonators are combined, the above-mentioned advantages become more distinctive since a capacitance can be formed in the resonator itself through combination of the definition of the polarizing portion and connecting methods of electrodes.

A ceramic resonator or ceramic filter associated with this invention functions as a filter by itself even if only one unit is used and any combination of plurality of units, of course, functions very effectively. In all cases, it is to be understood that certain embodiments have been described but this invention is not restricted thereto and it is intended for any combination of varied modifications and applications, without departing from the scope of the claims.

As described above in detail, a ceramic resonator of the present invention provides a new effect such that the vibration characteristics of a resonator are determined in accordance with a the shape of the resonator, but this invention is required only to deposit the electrode on the entire part of the main surface through fine treatment on the piezoelectric ceramic platelet in comparison with a resonator associated with the prior art which also attains similar objects by forming the electrode in such a form that the narrowed portion is formed at the central part with the piezoelectric ceramic platelet formed only as a rectangular plate. Therefore, this invention is not required to consider the necessity of electrode pattern and mask for those having the above-mentioned electrode shape and difficulty of alignment to the piezoelectric ceramic platelet and that between electrodes in both sides, and thereby provides very effective merits for the communication industry.

What is claimed is:

1. A ceramic resonator, comprising:
   an elongated piezoelectric ceramic platelet having an indentation transverse to and in the center of the longitudinal direction of said platelet, a polarization in the thickness direction and occurring at least in said indentation, and first and second main surfaces; and
   a first metal thin film electrode formed on said first main surface, a second metal thin film electrode formed on said second main surface, a third metal thin film electrode formed on said first main surface, and a fourth metal thin film electrode formed on said second main surface, said third electrode being electrically isolated from said first electrode and said fourth electrode being electrically isolated from said second electrode by areas of electrical isolation which are offset from each other in said longitudinal direction.

2. A ceramic resonator according to claim 1, wherein said identation is formed in at least one side surface thereby causing a reduction in the width.

3. A ceramic resonator according to claim 1, wherein indentations are formed in both side surfaces thereby causing a reduction in the width.

4. A ceramic resonator according to claim 1, 2 or 3, wherein the polarization is perpendicular to the longitudinal direction and occurs over the entire longitudinal direction of said piezoelectric ceramic platelet.

5. A ceramic resonator according to claim 4, wherein an electrical connection is made between said first and fourth electrodes and between said second and third electrodes.

6. A ceramic resonator according to claims 1, 2 or 3, wherein the polarization is perpendicular to the longitudinal direction and occurs only in the longitudinal portion of said piezoelectric ceramic platelet defined by said indentation.

7. A ceramic resonator according to claim 6, wherein an electrical connection is made between said first and fourth electrodes and between said second and third electrodes.

8. A ceramic resonator according to claims 1, 2 or 3, wherein an electrical connection is made between said first and fourth electrodes and between said second and third electrodes.

9. A ceramic resonator, comprising:
   an elongated piezoelectric ceramic platelet having an indentation transverse to and in the center of the longitudinal direction of said platelet, a polarization in the thickness direction and occurring at least in said indentation, and first and second main surfaces;
   a first metal thin film electrode formed on said first main surface, a second metal thin film electrode formed on said second main surface, a third metal thin film electrode formed on said first main surface, and a fourth metal thin film electrode formed on said second main surface, said third electrode being electrically isolated from said first electrode and said fourth electrode being separated from said second electrode by areas of electrical isolation which are offset from each other in said longitudinal direction; and
   a damping material, said damping material being provided at least on an edge surface of said piezoelectric ceramic platelet.

10. A ceramic filter, comprising a plurality of ceramic resonators connected in series, each of said ceramic resonators including
    an elongated piezoelectric ceramic platelet having an indentation transverse to and in the center of the longitudinal direction of said platelet, a polarization in the thickness direction and occurring at least in said indentation, and first and second main surfaces; and
    a first metal thin film electrode formed on said first main surface, a second metal thin film electrode formed on said second main surface, a third metal thin film electrode formed on said first main surface, and a fourth metal thin film electrode formed on said second main surface, said third electrode being electrically isolated from said first electrode and said fourth electrode being electrically isolated from said second electrode by areas of electrical isolation which are offset from each other in said longitudinal direction.

11. A ceramic filter according to claim 10, wherein the thickness of any one of said plurality of ceramic resonators is substantially different from the thickness of the other resonators.

12. A ceramic filter according to claim 11, wherein said series connection is also a junction of at least two capacitors connected in parallel.

13. A ceramic filter according to claim 8 or 11, wherein a pair of resonators, among said plurality of ceramic resonators, are respectively considered as a first and a second resonator; the second and third electrodes of said first and second resonators being connected to each other; said connecting point of said second and third electrodes being considered as a common end; the fourth electrode of said first or second resonator being considered as the input end; and, the other fourth electrode of said first or second resonator being considered as the output end.

* * * * *

UNITED STATES PATENT AND TRADEMARK OFFICE
CERTIFICATE OF CORRECTION

PATENT NO. :    4,511,202

DATED      :    April 16, 1985

INVENTOR(S) :   Yoshihiko Kasai

It is certified that error appears in the above-identified patent and that said Letters Patent is hereby corrected as shown below:

Column 2, line 3, before "affixed" insert --is--;
         line 35, after "the" insert --center--;
         line 36, ";" should be --.--;
         line 63, "$(2W_0\}$" should be --$(2W_o)\}$--.

Column 3, line 30, "82" should be --81--;
         line 54, "10-" should be --$10^{-4}$--.

Column 5, line 67, "portion" should be --portion.--; "metal should be --Metal--.

Column 6, line 33, "responsive" should be --respective--.

Column 7, line 1, change "is" to --are--; after "showing" insert --the frequency--.

Column 8, line 37, "1" (first occurrence) should be --$\ell$--.

Column 12, line 15, after "this" insert --invention--.

UNITED STATES PATENT AND TRADEMARK OFFICE
CERTIFICATE OF CORRECTION

PATENT NO. : 4,511,202

DATED      : April 16, 1985

INVENTOR(S) : Yoshihiko Kasai

It is certified that error appears in the above-identified patent and that said Letters Patent is hereby corrected as shown below:

Column 14, line 67, after "spurious" insert --responses--;
          line 68, "ating" should be --ated--.

Signed and Sealed this

Twenty-fourth Day of September 1985

[SEAL]

Attest:

DONALD J. QUIGG

Attesting Officer

Commissioner of Patents and Trademarks—Designate